United States Patent
Kim et al.

(10) Patent No.: US 12,100,326 B2
(45) Date of Patent: Sep. 24, 2024

(54) FLEXIBLE DISPLAY DEVICE, ROLLABLE DISPLAY APPARATUS INCLUDING FLEXIBLE DISPLAY DEVICE, AND METHOD FOR CONTROLLING FLEXIBLE DISPLAY DEVICE

(71) Applicant: LG Display Co., Ltd., Seoul (KR)

(72) Inventors: Sangyong Kim, Seoul (KR); Sangjae Lee, Paju-si (KR); Chanhui Seol, Sokcho-si (KR)

(73) Assignee: LG DISPLAY CO., LTD., Seoul (KR)

(*) Notice: Subject to any disclaimer, the term of this patent is extended or adjusted under 35 U.S.C. 154(b) by 138 days.

(21) Appl. No.: 17/491,040

(22) Filed: Sep. 30, 2021

(65) Prior Publication Data

US 2022/0172656 A1  Jun. 2, 2022

(30) Foreign Application Priority Data

Dec. 1, 2020  (KR) .................. 10-2020-0166042

(51) Int. Cl.
  *G09G 3/00* (2006.01)
  *G09G 3/3233* (2016.01)
  *H05K 5/02* (2006.01)

(52) U.S. Cl.
  CPC .......... *G09G 3/035* (2020.08); *G09G 3/3233* (2013.01); *H05K 5/0217* (2013.01); *G09G 2300/0439* (2013.01); *G09G 2300/0842* (2013.01); *G09G 2310/08* (2013.01); *G09G 2320/029* (2013.01); *G09G 2320/043* (2013.01)

(58) Field of Classification Search
  CPC ........ G09G 3/035; G09G 3/3233; G09G 5/18; G09G 2300/0439; G09G 2300/0842; G09G 2310/08; G09G 2320/029; G09G 2320/043; G09G 2320/045; G09G 2380/02; G09F 9/301; G09F 9/33; G06F 1/1652; H05K 5/0217
  See application file for complete search history.

(56) References Cited

U.S. PATENT DOCUMENTS 9,245,477 B2  1/2016  Kwack et al.
10,365,690 B2  7/2019  In et al.
(Continued)

FOREIGN PATENT DOCUMENTS

CN  103514814 A  1/2014
CN  108735100 A  11/2018
(Continued)

*Primary Examiner* — David Tung
(74) *Attorney, Agent, or Firm* — Birch, Stewart, Kolasch & Birch, LLP

(57) ABSTRACT

Discussed are a flexible display device, a rollable display apparatus including the flexible display device, and a method for controlling the flexible display device. According to embodiments, a sensing operation is performed based on whether a display panel included in the flexible display device moves and based on an exposed area of the display panel. Accordingly, an inaccurate sensed value due to a physical change of the display panel are not considered, such that accurate sensing and deterioration compensation for deterioration of the display panel can be achieved. Further, an image quality of each of the flexible display device, and the rollable display apparatus including the flexible display device can be improved.

10 Claims, 10 Drawing Sheets

(56) References Cited

U.S. PATENT DOCUMENTS

| | | | |
|---|---|---|---|
| 10,599,185 B2 | 3/2020 | Yu et al. | |
| 10,681,174 B2 | 6/2020 | In et al. | |
| 10,719,284 B2 | 7/2020 | Yamazaki et al. | |
| 10,969,830 B2 | 4/2021 | In et al. | |
| 11,011,083 B2 | 5/2021 | Kim et al. | |
| 11,216,138 B2 | 1/2022 | Yamazaki et al. | |
| 2013/0127917 A1* | 5/2013 | Kwack | G06F 1/1652 345/660 |
| 2014/0118317 A1* | 5/2014 | Song | G06F 1/1652 345/204 |
| 2016/0307545 A1* | 10/2016 | Lee | G09G 5/346 |
| 2017/0103735 A1* | 4/2017 | Oh | G09G 5/006 |
| 2018/0032106 A1* | 2/2018 | Yu | G06F 1/1652 |
| 2019/0235577 A1* | 8/2019 | Wang | G06F 1/1652 |
| 2019/0355328 A1* | 11/2019 | Suk | G09G 3/035 |
| 2020/0168153 A1* | 5/2020 | Wakata | G09G 3/035 |
| 2021/0201722 A1* | 7/2021 | Jeong | G09F 9/301 |

FOREIGN PATENT DOCUMENTS

| | | |
|---|---|---|
| CN | 111223407 A | 6/2020 |
| CN | 111708506 A | 9/2020 |
| KR | 10-2017-0122313 A | 11/2017 |
| KR | 10-2018-0014386 A | 2/2018 |
| KR | 10-2019-0071486 A | 6/2019 |
| KR | 10-2020-0113532 A | 10/2020 |
| KR | 10-2020-0118264 A | 10/2020 |

* cited by examiner

[FIG. 1]
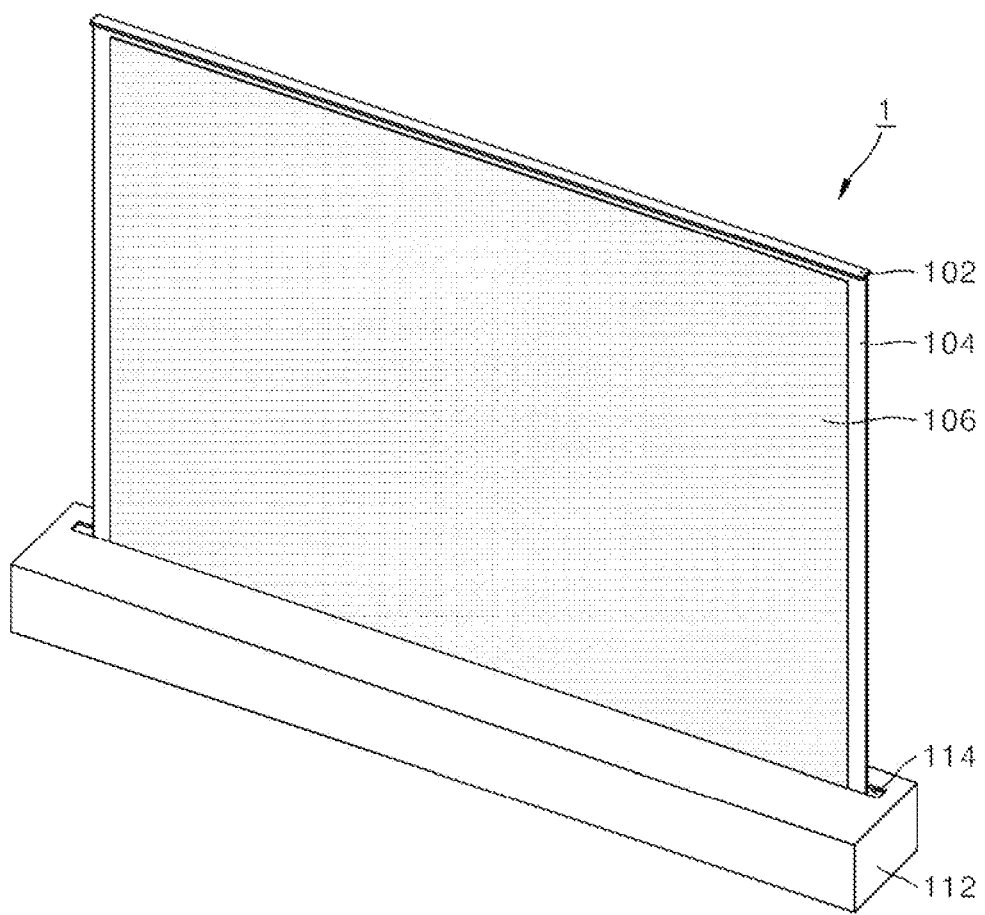

[FIG. 2]
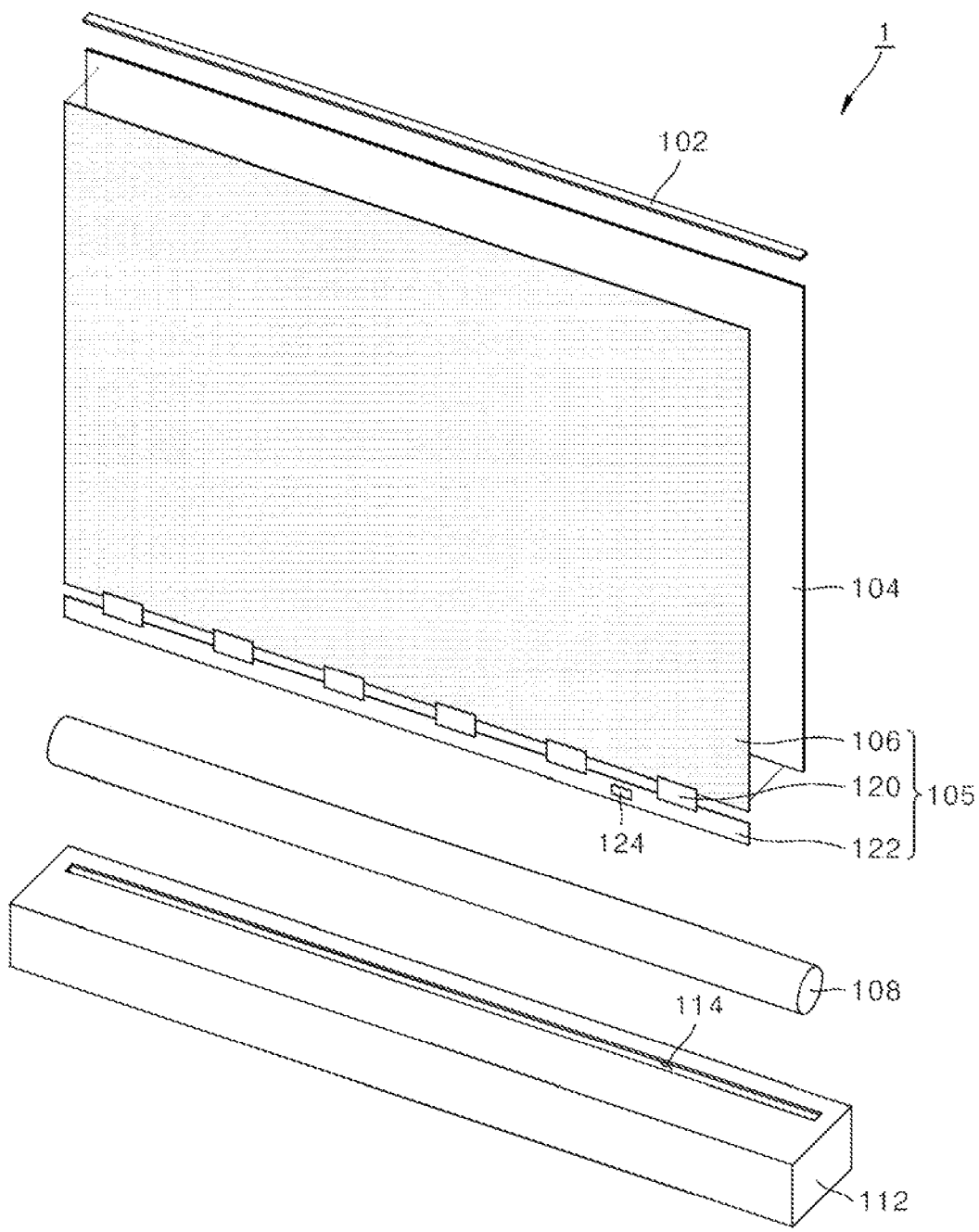

【FIG. 3】
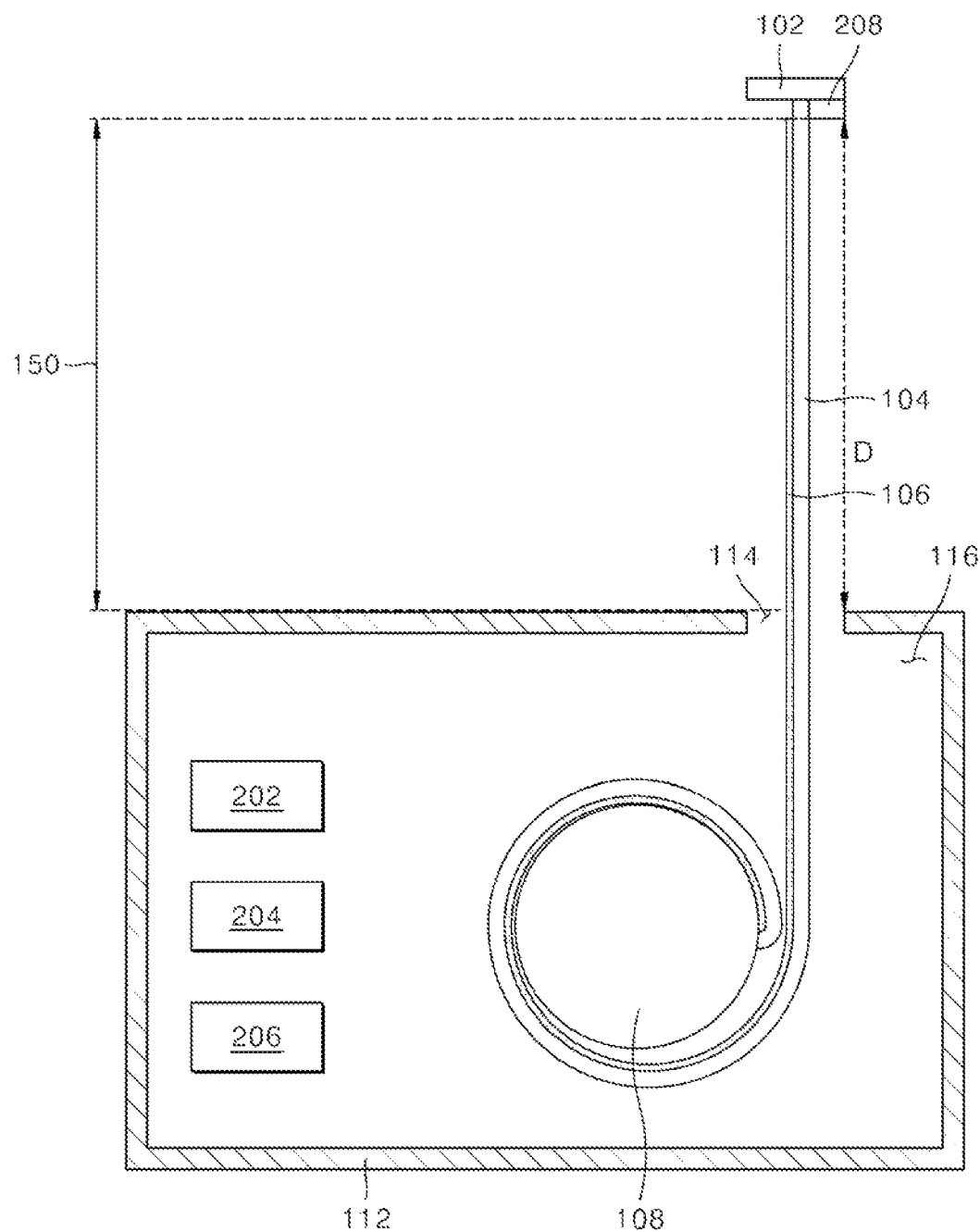

[FIG. 4]
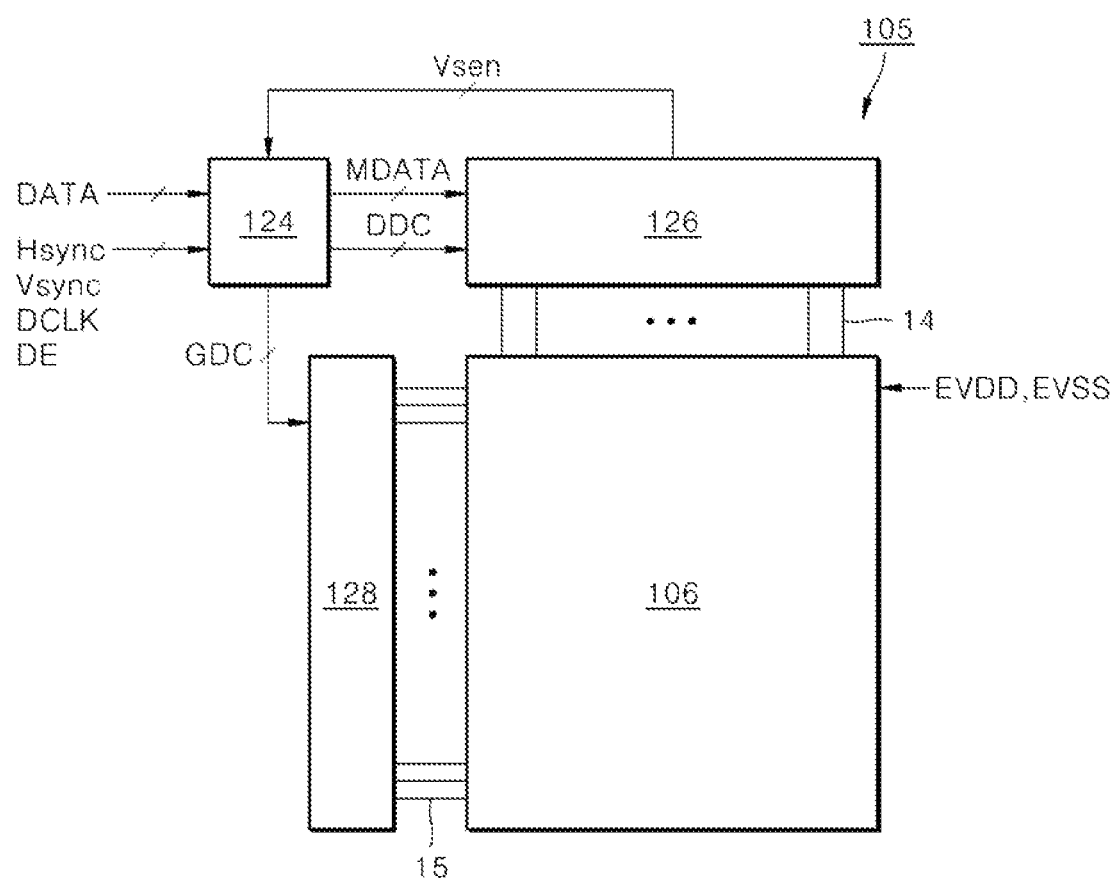

[FIG. 5]
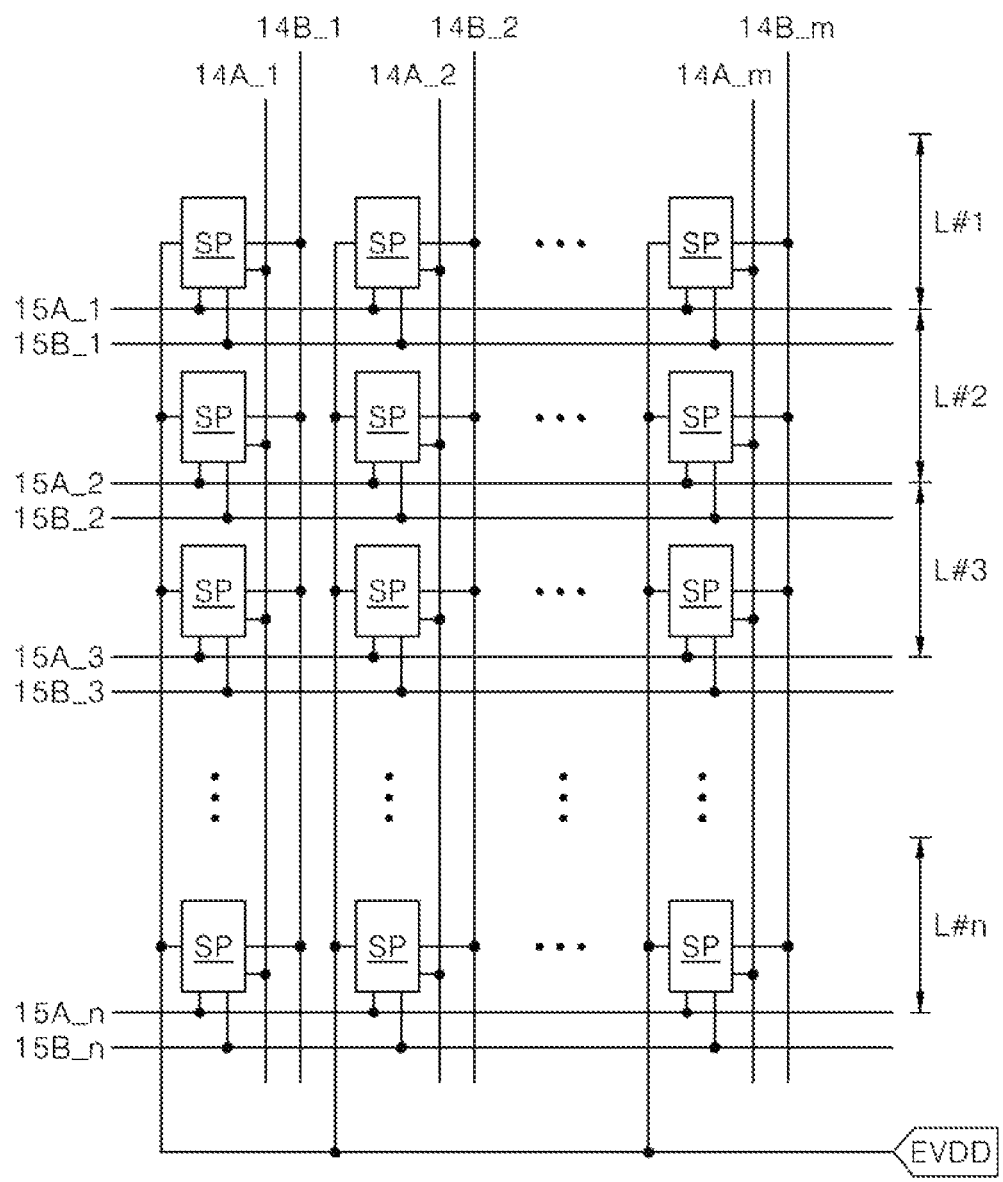

[FIG. 6]
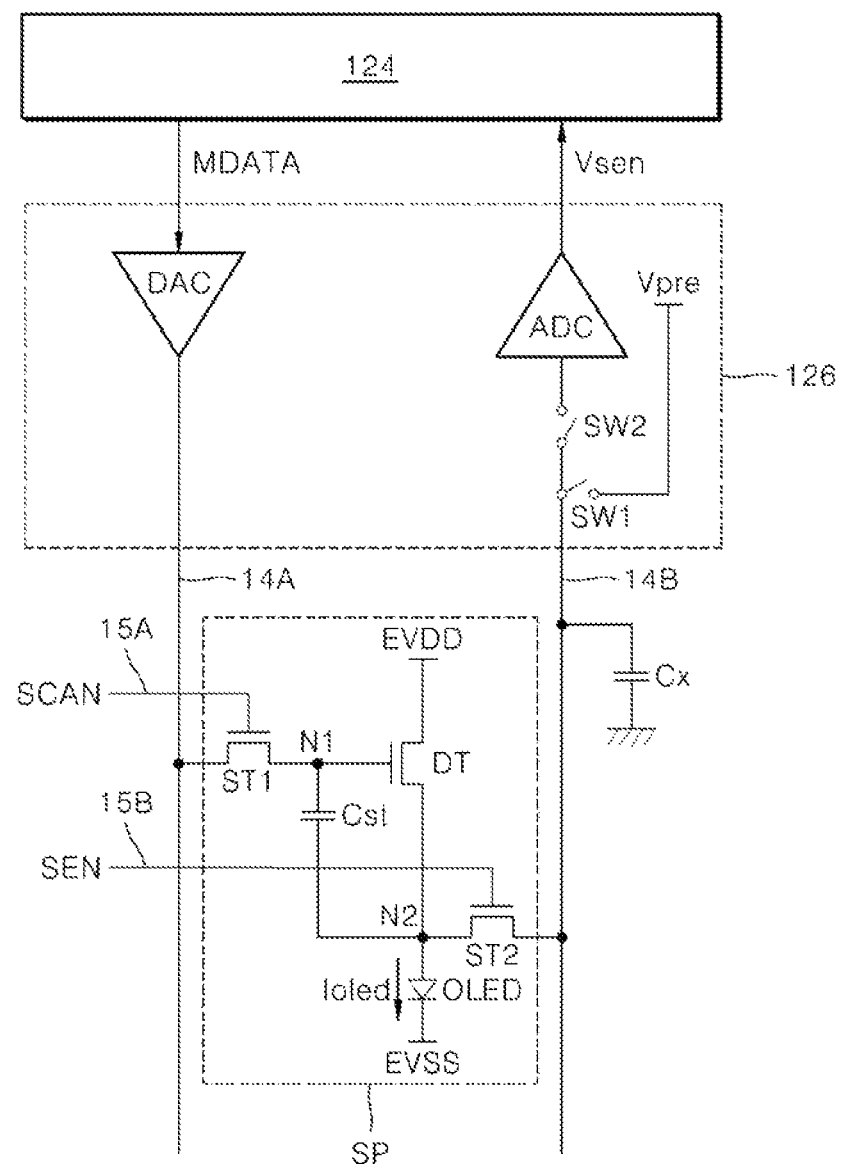

[FIG. 7]
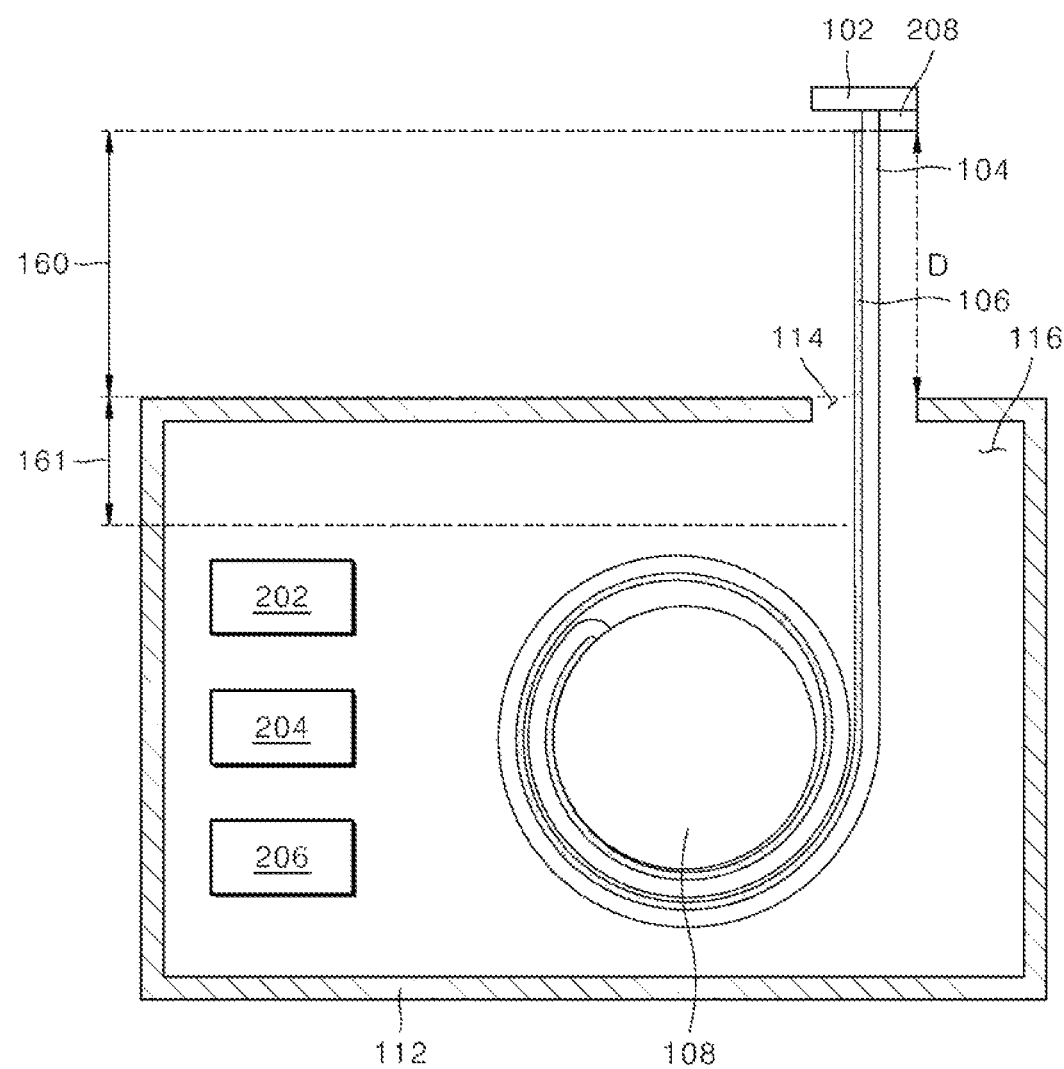

【FIG. 8】
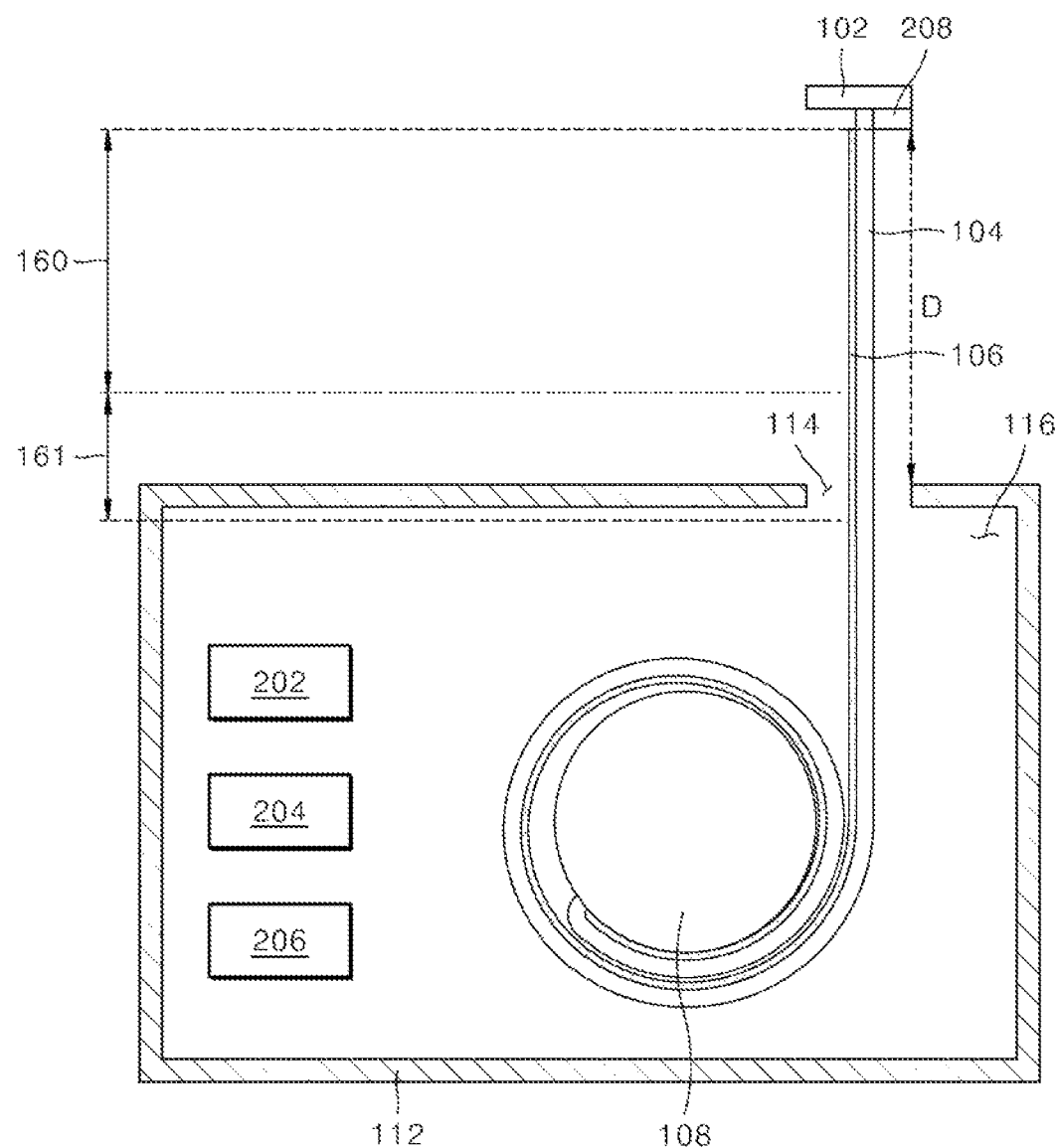

[FIG. 9]
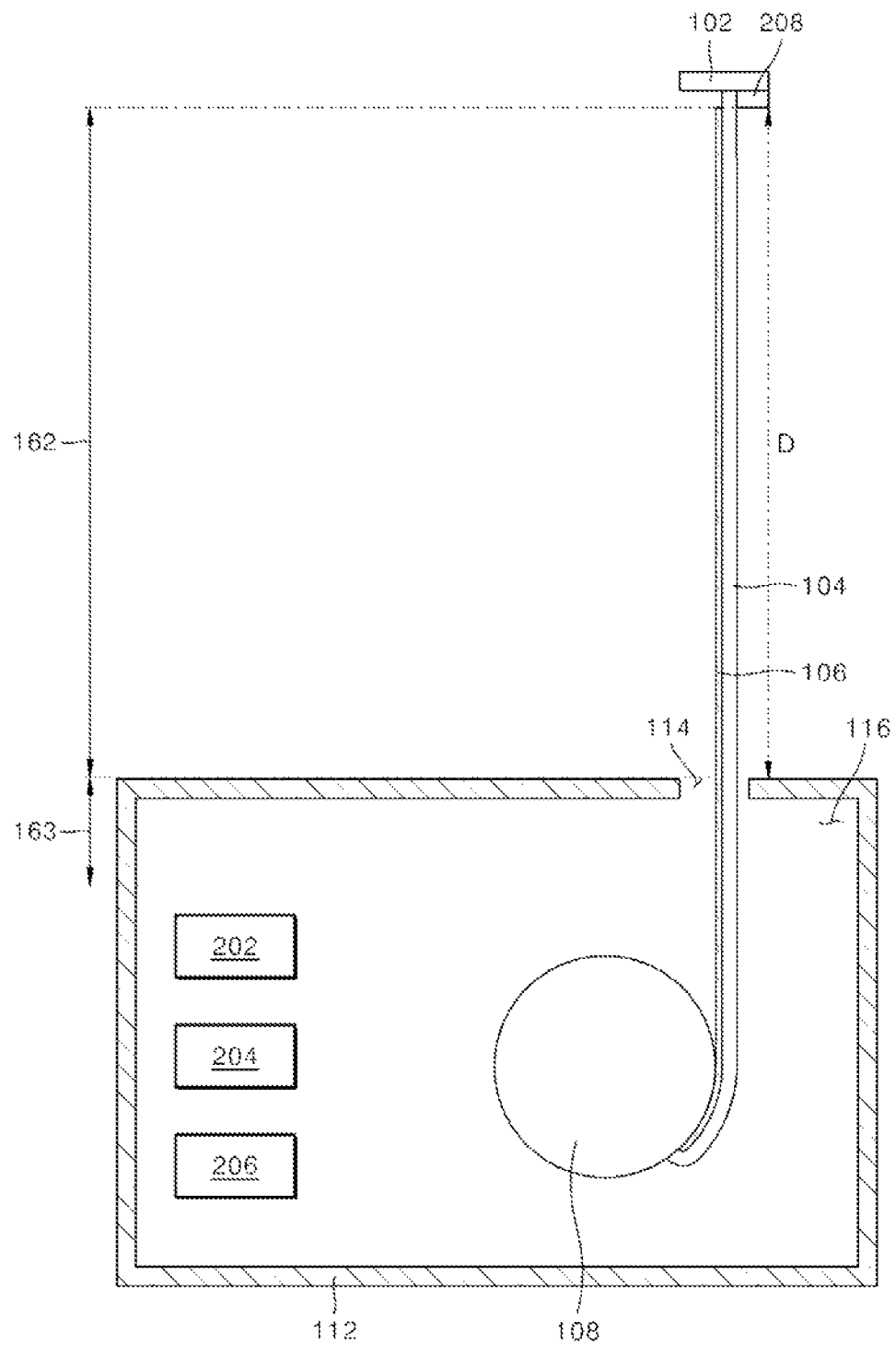

[FIG. 10]
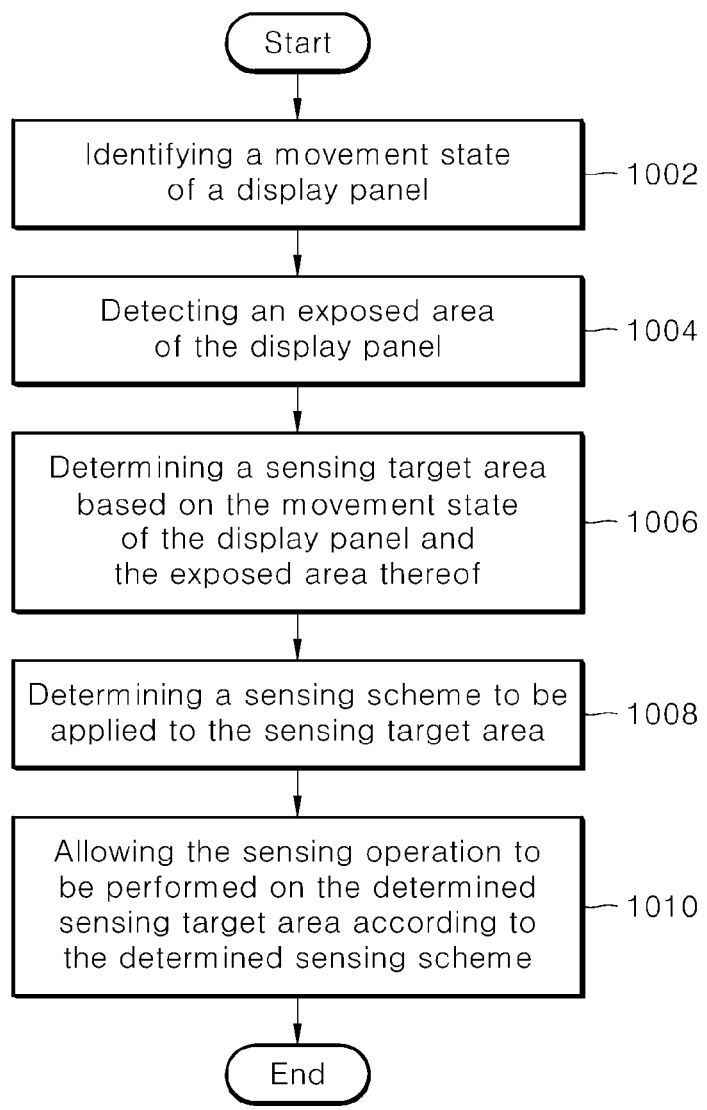

FLEXIBLE DISPLAY DEVICE, ROLLABLE DISPLAY APPARATUS INCLUDING FLEXIBLE DISPLAY DEVICE, AND METHOD FOR CONTROLLING FLEXIBLE DISPLAY DEVICE

CROSS-REFERENCE TO RELATED APPLICATION

This application claims priority to and the benefit of Korean Patent Application No. 10-2020-0166042, filed in the Republic of Korea on Dec. 1, 2020, the entire contents of which are expressly incorporated herein by reference into the present application.

BACKGROUND

Field

The present disclosure relates to a flexible display device, a rollable display apparatus including a flexible display device, and a method for controlling the flexible display device.

Description of Related Art

Recently, a display device using a flat display panel such as a liquid crystal display device, an organic light-emission display device, a light-emission diode display device, and an electrophoretic display device has been widely used.

The organic light-emission display device displays an image through sub-pixels each including an organic light-emission element as a self-light-emission element. Therefore, the organic light-emission display device has advantages of a smaller thickness, a wider viewing angle, and a faster response speed, compared to other display devices. However, the sub-pixel of the organic light-emission display device may be deteriorated due to various causes. When the sub-pixel is deteriorated, normal image display can become difficult and thus, a lifespan of the organic light-emission display device may be shortened. Accordingly, various technologies are applied to compensate for the sub-pixel degradation of the organic light-emission display device.

Further, a flat display panel according to the related art has limitations in its application and use because such flat display panel uses a rigid glass substrate free of flexibility. In recent years, a flexible display device that can bend using a flexible substrate made of plastic, etc., instead of the rigid glass substrate free of the flexibility, is attracting attention as the next-generation display device. Further, new types of display apparatuses using the flexible display device are being developed.

SUMMARY OF THE PRESENT DISCLOSURE

One of the new types of display apparatuses using the flexible display device is a rollable display apparatus. In the rollable display apparatus according to the related art, the display panel included in the flexible display device is connected to a roller and wound around or released from the roller. However, when the display panel is wound around the roller or bent, electrical characteristics of elements or conductors included in the display panel may change due to the physical deformation of the display panel.

In one example, when a sub-pixel included in the display panel of the flexible display device includes an organic light-emission element, a sensing operation needs to be performed to compensate for sub-pixel degradation. However, as described above, when the display panel in the rollable display apparatus is physically deformed according to the related art, the electrical characteristics of the elements or conductors included in a deformed area can change. Therefore, when the sensing operation is performed while the display panel is wound around the roller or bent, the deterioration compensation for the sub-pixel may not be normally performed, and thus correct image display may not be realized.

Further, when a sensing operation for a first area of the display panel wound around the roller or bent, and for a second area thereof not wound around the roller while a portion of the display panel is wound around the roller or bent, and then a compensation operation for each of the first and second areas is performed based on the sensing result. However, the sensing results for the first area wound around the roller or bent and the second area not wound around the roller may be different from each other due to the change in the electrical characteristics of the first area wound around the roller, and thus the compensation results therefor may be different from each other. As a result, while a portion of the display panel according to the related art is wound around the roller or bent, there may be a difference between an image quality of the first area that is wound around the roller or bent and an image quality of the second area that is not wound around the roller. This difference can be expressed as a borderline or a block-shaped stain on the display panel when an image is displayed through the rollable display apparatus, which can cause the image quality of the rollable display apparatus to deteriorate.

To address the above-identified limitations and other disadvantages associated with the related art, a purpose of the present disclosure is to provide a flexible display device, a rollable display apparatus including the flexible display device, and a method for controlling the flexible display device, in which a sensing operation to compensate for the deterioration of the sub-pixel is performed in consideration of whether the display panel moves and an exposed area of the display panel, thereby achieving more accurate sensing and deterioration compensation.

Another purpose of the present disclosure is to provide a flexible display device, a rollable display apparatus including the flexible display device, and a method for controlling the flexible display device, in which no borderline or block-shaped stains occur on the display panel when an image is displayed, thereby achieving high image quality.

Still another purpose of the present disclosure is to provide a flexible display device, a rollable display apparatus including the flexible display device, and a method for controlling the flexible display device, in which a sensing operation is performed only on a specific area of the display panel when an image is displayed, thereby increasing a speed of deterioration compensation of the display panel.

Purposes to be achieved according to one or more embodiments of the present disclosure are not limited to the above-mentioned purposes. Other purposes that are not mentioned will be clearly understood by those skilled in the art from following descriptions.

A flexible display device according to one or more embodiments of the present disclosure includes a display panel which moves through a panel passage opening formed in a housing and includes a plurality of sub-pixels, and a timing controller that controls an image display operation of the plurality of sub-pixels or a sensing operation to compensate for deterioration of the plurality of sub-pixels.

In this connection, the timing controller identifies a movement state of the display panel, for example, whether the display panel is moving or stopped.

Further, the timing controller detects an exposed area of the display panel. In accordance with the present disclosure, the exposed area refers to a portion of an entire area of the display panel that is exposed outwardly of the housing and is visible to a user. Conversely, a non-exposed area refers to a portion of the entire area of the display panel that is not exposed outwardly of the housing and is not visible to the user.

The timing controller determines a sensing target area based on the movement state of the display panel and the exposed area thereof. In accordance with the present disclosure, the sensing target area refers to a portion of the entire area of the display panel on which a sensing operation for deterioration compensation is performed.

Further, the timing controller determines a sensing scheme for the sensing target area. In accordance with the present disclosure, the sensing scheme includes a random sensing scheme and a sequential sensing scheme. When the sensing scheme is designated as the random sensing scheme, the timing controller is configured to randomly select one of lines included in the sensing target area and allow the selected line to be sensed. When the sensing scheme is designated as the sequential sensing scheme, the timing controller is configured to allow sensing operations of lines included in the sensing target area to be sequentially performed according to a predefined order.

The timing controller is configured to allow a sensing operation for the sensing target area to be performed according to the determined sensing scheme.

Further, a rollable display apparatus according to an embodiment of the present disclosure includes a housing in which a panel passage opening is formed, a roller mounted inside the housing, a motor connected to the roller to rotate the roller, and a flexible display device wound around the roller and moving through the panel passage opening under rotation of the roller.

The flexible display device includes a display panel including a plurality of sub-pixels, and a timing controller that controls an image display operation of the plurality of sub-pixels or a sensing operation to compensate for deterioration of the plurality of sub-pixels.

In this connection, the timing controller identifies a movement state of the display panel, for example, whether the display panel is moving or stopped. Further, the timing controller detects an exposed area of the display panel.

The timing controller determines a sensing target area based on the movement state of the display panel and the exposed area thereof. Further, the timing controller determines a sensing scheme for the sensing target area.

The timing controller is configured to allow a sensing operation for the sensing target area to be performed according to the determined sensing scheme.

Further, a method for controlling a flexible display device according to an embodiment of the present disclosure includes identifying a movement state of a display panel, detecting an exposed area of the display panel, determining a sensing target area on which a sensing operation to compensate for deterioration of the plurality of sub-pixels is to be performed, based on the movement state of the display panel and the exposed area thereof, determining a sensing scheme to be applied to the sensing target area, and allowing a sensing operation to be performed on the sensing target area according to the determined sensing scheme.

According to the embodiments of the present disclosure, the sensing operation is performed in consideration of whether the display panel included in the flexible display device moves, and the exposed area thereof. For example, in the embodiment of the present disclosure, the sensing operation and the deterioration compensation are performed only on a portion of the entire area of the display panel that is visible to the user, while the sensing operation and the deterioration compensation are not performed on a portion thereof that is not visible to the user. Accordingly, since inaccurate sensed values due to physical changes of the display panel are not considered, accurate sensing and deterioration compensation for display panel deterioration are realized. Further, an image quality of each of the flexible display device and the rollable display apparatus including the flexible display devices is improved.

Further, according to the embodiments of the present disclosure, when an image is displayed on the flexible display device, or the rollable display apparatus including the flexible display device, no borderline or block-shaped stain occur on the display panel. Therefore, the image quality of each of the flexible display device and the rollable display apparatus including the flexible display device is improved.

Further, according to the embodiments of the present disclosure, when an image is displayed on the flexible display device, or the rollable display apparatus including the flexible display device, the sensing operation is performed only on a specific area of the display panel, for example, an area in which the image is being displayed or an area in which an image is to be displayed due to extension of the display panel. Therefore, the sensing speed of the display panel and the corresponding deterioration compensation speed can be improved, such that the image quality of each of the flexible display device and the rollable display apparatus including the flexible display device is improved.

Effects of the present disclosure are not limited to the above-mentioned effects. Other effects not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

FIG. 1 is a perspective view of a rollable display apparatus according to an embodiment of the present disclosure.

FIG. 2 is an exploded perspective view of a rollable display apparatus according to an embodiment of the present disclosure.

FIG. 3 is a vertical cross-sectional view of a rollable display apparatus according to an embodiment of the present disclosure.

FIG. 4 is a block diagram showing a configuration of a flexible display device according to an embodiment of the present disclosure.

FIG. 5 shows a configuration of a sub-pixel array included in a display panel according to an embodiment of the present disclosure.

FIG. 6 shows a circuit configuration of a sub-pixel, and a connection structure between a timing controller, a data driver circuit, and the sub-pixel according to an embodiment of the present disclosure.

FIG. 7 shows a state in which a portion of a display panel of a rollable display apparatus is exposed and the display panel is stopped according to an embodiment of the present disclosure.

FIG. 8 shows a situation in which an exposed area increases as the display panel of the rollable display apparatus shown in FIG. 7 moves in an extending direction.

FIG. 9 shows a state in which the movement of the display panel of the rollable display apparatus shown in FIG. 8 is completed.

FIG. 10 is a flow chart showing a method for controlling a flexible display device according to an embodiment of the present disclosure.

DETAILED DESCRIPTION OF THE EMBODIMENTS

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

In descriptions of temporal relationships, for example, temporal precedent relationships between two events such as "after", "subsequent to", "before", etc., another event can occur therebetween unless "directly after", "directly subsequent" or "directly before" is indicated.

In descriptions of a signal flow relationship, for example, when a signal is transmitted from a node A to a node B, the signal can be transmitted from the node A to the node B via a node C unless the signal is transmitted from the node A directly to the node B.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

FIG. 1 is a perspective view of a rollable display apparatus according to an embodiment of the present disclosure. FIG. 2 is an exploded perspective view of the rollable display apparatus according to an embodiment of the present disclosure. Further, FIG. 3 is a vertical cross-sectional view of the rollable display apparatus according to an embodiment of the present disclosure. All the components of each rollable display apparatus according to all embodiments of the present disclosure are operatively coupled and configured.

Referring to FIGS. 1 to 3, a rollable display apparatus 1 according to an embodiment of the present disclosure includes an upper cover 102, a support panel 104, a flexible display device 105, a roller 108, and a housing 112.

The upper cover 102 is coupled to a top of the support panel 104. In one embodiment of the present disclosure, the support panel 104 and a display panel 106 can move into the housing 112 through a panel passage opening 114 formed in the housing 112 while being wound around the roller 108. Thus, each of the support panel 104 and the display panel 106 can be retracted and then an entirety of the support panel 104 and the display panel 106 can be inserted into an inner space 116 of the housing 112, such that the upper cover 102 is received in the panel passage opening 114. Therefore, the upper cover 102 can have a size and a shape corresponding to those of the panel passage opening 114.

The support panel 104 is disposed in rear of the display panel 106. The support panel 104 is combined with the display panel 106 to support the display panel 106. The support panel 104 can be made of a soft material and thus can be wound around the roller 108, or can include a structure that can be wound around the roller 108, for example, a plurality of unit panels separated from each other in an extending direction. A top of the support panel 104 is connected to the upper cover 102, and a bottom of the support panel 104 is connected to an outer peripheral face of the roller 108. As the roller 108 rotates, the support panel 104 and the display panel 106 combined with the support panel 104 can be wound around the outer peripheral face of the roller 108 or released from the outer peripheral face of the roller 108.

The flexible display device 105 includes the display panel 106, a soft circuit film 120, and a printed circuit board 122.

The display panel 106 is embodied as a flat panel display panel using a flexible substrate made of a soft material, such as plastic. The display panel 106 can include a sub-pixel array and a gate driving circuit formed on the flexible substrate.

Further, a plurality of soft circuit films 120 are connected to one side of the display panel 106. The soft circuit film 120 can be embodied as a TCP (Tape Carrier Package), or a COF (Chip On Flexible Board or Chip On Film). A data driving circuit that supplies image data to each sub-pixel on the display panel 106 is disposed on one face of the soft circuit film 120. The data driving circuit can be implemented in a form of an integrated circuit, but is not limited thereto.

Further, the printed circuit board 122 is connected to one side of the soft circuit film 120. A timing controller 124 that controls operations of the data driving circuit and a gate driving circuit is placed on the printed circuit board 122.

The timing controller 124 is mounted on the printed circuit board 122. The timing controller 124 receives image data and a timing synchronization signal provided from a host system via a connector provided on the printed circuit board 122. The timing controller 124 generates image data to be supplied to each sub-pixel based on the timing synchronization signal, and transmits the generated image data to the data driving circuit.

Further, the timing controller 124 generates a data control signal and a gate control signal based on the timing synchronization signal. The timing controller 124 controls an operation timing of the data driving circuit via the data control signal, and controls an operation timing of the gate driving circuit via the gate control signal.

In one embodiment of the present disclosure, the timing controller 124 controls a sensing circuit included in each sub-pixel so that a sensing operation for deterioration compensation of each sub-pixel is performed. The timing controller 124 generates compensation data to compensate for the degradation of each sub-pixel based on the sensed data generated by the sensing operation. The timing controller 124 compensates for the image data provided from a main controller 202 based on the generated compensation data, and transfers the compensated image data to the data driving circuit.

The housing 112 has a polyhedral shape having an empty space defined therein. The shape and a material of the housing 112 can vary according to embodiments. The inner space 116 of the housing 112 can receive therein the main controller 202, the motor 204, a motor controller 206 and the roller 108.

The main controller 202 controls all operations of the rollable display apparatus 1. The main controller 202 can send a motor control command to the motor controller 206 to drive the motor 204 to move the display panel 106.

Further, the main controller 202 can transmit image data to be displayed on the display panel 106 to the timing controller 124.

The motor controller 206 controls an operation of the motor 204 under control of the main controller 202. The motor controller 206 can rotate the motor 204 or stop the motor 204 according to the motor control command transmitted from the main controller 202.

The motor 204 can be rotated or stopped according to the control of the motor controller 206. The motor 204 rotates in a first direction or a second direction opposite to the first direction according to the control of the motor controller 206. The motor 204 is connected to the roller 108. Therefore, when the motor 204 rotates in the first direction, the roller 108 rotates in the first direction. When the motor 204 rotates in the second direction, the roller 108 rotates in the second direction.

The roller 108 has a structure with a cylindrical shape. The roller 108 is connected to the motor 204 and is rotated under an operation of the motor 204. In some embodiments, the motor 204 can be built into the roller 108.

The support panel 104 is connected to the outer peripheral face of the roller 108. When the roller 108 rotates in the first direction under the rotation of the motor 204, the support panel 104 and the display panel 106 are wound around an outer circumference of the roller 108, such that the display panel 106 moves into the inner space 116 of the housing 112 through the panel passage opening 114. In accordance with the present disclosure, the rotation of the roller 108 in the first direction such that the display panel 106 moves into the inner space 116 of the housing 112 is defined as retraction of the display panel 106.

On the contrary, when the roller 108 rotates in the second direction under the rotation of the motor 204, the support panel 104 and the display panel 106 wound around the outer circumference of the roller 108 are released such that the display panel 106 is drawn out of the housing 112 through the panel passage opening 114. In accordance with the present disclosure, the rotation of the roller 108 in the second direction such that the display panel 106 is drawn out of the housing 112 is defined as extension of the display panel 106.

In other words, the extension of the display panel 106 in accordance with the present disclosure means that as the display panel 106 is drawn out of the housing 112, a size of the exposed area of the display panel 106, for example, a size of a portion of an entire area of the display panel 106 that is visible to the user increases. Further, in accordance with the present disclosure, the extension of the display panel 106 can preferably mean that the display panel 106 or the upper cover 102 of the display panel 106 moves in a direction away from the panel passage opening 114.

Conversely, the retraction of the display panel 106 in accordance with the present disclosure can preferably mean that the size of the exposed area of the display panel 106 decreases as the display panel 106 moves into the housing 112. Further, the retraction of the display panel 106 in accordance with the present disclosure can preferably mean that the display panel 106 or the upper cover 102 of the display panel 106 moves in a direction towards or closer to the panel passage opening 114.

FIG. 3 shows an exposed area 150 of the display panel 106.

In accordance with the present disclosure, a portion except for the exposed area 150 of the entire area of the display panel 106 is defined as a non-exposed area.

In one example, in one embodiment of the present disclosure, a sensor 208 can be mounted at one end of the display panel 106. For example, as shown in FIG. 3, the sensor 208 can be mounted on a top of a rear face of the support panel 104 coupled to the display panel 106.

The sensor 208 senses a distance D from a location of the sensor 208 to a top face of the housing 112. The distance D sensed by the sensor 208 can be transmitted in real time to the timing controller 124 via the main controller 202 or directly to the timing controller 124 in real time.

In an embodiment of the present disclosure, the position of the sensor 208 can coincide with a top of the display panel 106. Therefore, the distance D between the sensor 208 and the top face of the housing 112 as sensed by the sensor 208 can be considered to correspond to the size of the exposed area 150 of the display panel 106.

Examples of the sensor 208 can include an infrared sensor or a laser sensor, but a type of the sensor 208 is not limited thereto. Further, the location of the sensor 208 can vary according to embodiments. Further, in some the embodiment, the sensor 208 may not be mounted on the flexible display device.

FIG. 4 is a block diagram showing a configuration of a flexible display device according to an embodiment of the present disclosure. Further, FIG. 5 shows a configuration of a sub-pixel array included in the display panel of the flexible display device according to an embodiment of the present disclosure.

Referring to FIGS. 4 and 5, the flexible display device 105 according to an embodiment of the present disclosure includes the display panel 106, a data driver circuit 126, a gate driver circuit 128, and the timing controller 124.

In the display panel 106, a plurality of data lines 14 and a plurality of gate lines 16 are intersected with each other. Further, sub-pixels SP are arranged in a matrix form, wherein each sub-pixel is disposed in each of intersection areas between the data lines 14 and the gate lines 16.

The data lines 14 include m (m is a positive integer number) data voltage supply lines 14A_1 to 14A_m, and m sensed voltage readout lines 14B_1 to 14B_m. Moreover, the gate lines 15 include n (n is a positive integer number) first gate lines 15A_1 to 15A_n and n second gate lines 15B_1 to 15B_n.

Each sub-pixel SP is connected to one of the data voltage supply lines 14A_1 to 14A_m, to one of the sensed voltage readout lines 14B_1 to 14B_m, to one of the first gate lines 15A_1 to 15A_n, and to one of the second gate lines 15B_1 to 15B_n. The sub-pixels SP can render different colors, and a predefined number of sub-pixel SPs can form one pixel P.

Each sub-pixel SP receives a data voltage through the data voltage supply line, receives a first gate pulse through the first gate line, receives a second gate pulse through the second gate line, and outputs the sensed voltage through the sensed voltage readout line.

For example, in the sub-pixel array shown in FIG. 5, the sub-pixels SP operate on a 1 horizontal line basis (per each of L #1 to L #n) in response to a first gate pulse supplied from the first gate lines 15A_1 to 15A_n on a horizontal line basis, and a second gate pulse supplied from the second gate lines 15B_1 to 15B_n on a horizontal line basis. The sub-pixels SP in the same horizontal line on which the sensing operation is activated receive a data voltage for sensing a threshold voltage from the data voltage supply lines 14A_1 to 14A_m and output the sensed voltage to the sensed voltage readout lines 14B_1 to 14B_m. Each of the first gate pulse and the second gate pulse can be a gate pulse for sensing a threshold voltage or a gate pulse for displaying an image. However, the present disclosure is not limited thereto.

Each of the sub-pixels SP receives a high potential drive voltage EVDD and a low potential drive voltage EVSS from a power supply circuit. The sub-pixel SP can include an OLED, a driving TFT, first and second switching TFTs, and a storage capacitor. In an example of FIG. 6, it is shown that the sub-pixel SP includes an OLED. However, in some embodiments, a light source other than OLED can be included in the sub-pixel SP.

Each of TFTs constituting the sub-pixel SP can be implemented as a p-type or n-type TFT. Further, a semiconductor layer of each of TFTs constituting the sub-pixel SP can include amorphous silicon or polysilicon or oxide.

During a sensing operation for sensing a threshold voltage of the driving TFT, the data driver circuit 126 supplies the data voltage for sensing the threshold voltage to the sub-pixels SP according to a first gate pulse for sensing the threshold voltage supplied on a horizontal line basis, and converts the sensed voltages input from the display panel 106 through the sensed voltage readout lines 14B_1 to 14B_m into digital values, and supplies the digital values to the timing controller 124. During an image display operation, the data driver circuit 126 converts compensated image data MDATA input from the timing controller 124 into a data voltage for displaying an image, based on a data control signal DDC, and supplies the converted data voltage to the data voltage supply lines 14A_1 to 14A_m.

The gate driver circuit 128 generates a gate pulse based on a gate control signal GDC. The gate pulse can include a first gate pulse for sensing a threshold voltage, a second gate pulse for sensing a threshold voltage, a first gate pulse for displaying an image, and a second gate pulse for displaying an image.

During the sensing operation, the gate driver circuit 128 supplies the first gate pulse for sensing the threshold voltage to the first gate lines 15A_1 to 15A_n on a horizontal line basis, and supplies the second gate pulse for sensing the threshold voltage to the second gate lines 15B_1 to 15B_n on a horizontal line basis. During the image display operation, the gate driver circuit 128 supplies the first gate pulse for displaying an image to the first gate lines 15A_1 to 15A_n on a horizontal line basis and supplies the second gate pulse for displaying an image to the second gate lines 15B_1 to 15B_n on a horizontal line basis. In an embodiment of the present disclosure, the gate driver circuit 128 can be disposed on the display panel 106 in a GIP (Gate-driver In Panel) manner.

The timing controller 124 outputs the data control signal DDC for controlling an operation timing of the data driver circuit 126, and the gate control signal GDC for controlling an operation timing of the gate driver circuit 128, based on timing signals including a vertical synchronization signal Vsync, a horizontal synchronization signal Hsync, a dot clock signal DCLK, and a data enable signal DE. Further, the timing controller 124 compensates for the image data DATA based on the sensed value supplied from the data driver circuit 126, thereby generating the compensated image data MDATA to compensate for a threshold voltage deviation of the driving TFT, and supplies the compensated image data MDATA to the data driver circuit 126.

FIG. 6 shows a circuit configuration of a sub-pixel and a connection structure between a timing controller, a data driver circuit, and a sub-pixel according to an embodiment of the present disclosure.

Referring to FIG. 6, a sub-pixel SP includes an OLED, a driving TFT DT, a storage capacitor Cst, a first switching TFT ST, and a second switching TFT ST2.

The OLED includes an anode connected to a second node N2, a cathode connected to an input terminal of a low-potential drive voltage EVSS, and an organic compound layer positioned between the anode and the cathode.

The driving TFT DT is electrically conductive according to a gate-source voltage Vgs to control a current Ioled flowing through the OLED. The driving TFT DT includes a gate electrode connected to a first node N1, a drain electrode connected to an input terminal of a high potential drive voltage EVDD, and a source electrode connected to the second node N2.

The storage capacitor Cst is connected to and disposed between the first node N1 and the second node N2.

The first switching TFT ST1 applies the data voltage for sensing a threshold voltage Vdata charged in the data voltage supply line 14A to the first node N1 in response to the first gate pulse for sensing a threshold voltage SCAN during the sensing operation. The first switching TFT ST1 applies the data voltage for displaying an image charged in the data voltage supply line 14A to the first node N1 in response to the first gate pulse for displaying an image SCAN during the image display operation. The first switching TFT ST1 includes a gate electrode connected to the first gate line 15A, a drain electrode connected to the data voltage supply line 14A, and a source electrode connected to the first node N1.

The second switching TFT ST2 switches current flow between the second node N2 and the sensed voltage readout line 14B in response to the second gate pulse for sensing a threshold voltage SEN during the sensing operation, such that a source voltage of the second node N2 changing based on a gate voltage of the first node N1 is stored in a sensing capacitor Cx of the sensed voltage readout line 14B. The second switching TFT ST2 switches current flow between the second node N2 and the sensed voltage readout line 14B in response to the second gate pulse for displaying an image during the image display operation, such that a source voltage of the driving TFT DT is reset to an initialization voltage Vpre. A gate electrode of the second switching TFT ST2 is connected to the second gate line 15B, a drain electrode of the second switching TFT ST2 is connected to the second node N2, and a source electrode of the second switching TFT ST2 is connected to the sensed voltage readout line 14B.

The data driver circuit 126 is connected to the sub-pixel SP via the data voltage supply line 14A and the sensed voltage readout line 14B. The sensing capacitor Cx for storing a source voltage of the second node N2 as a sensed voltage Vsen is connected to the sensed voltage readout line 14B. The data driver circuit 126 includes a digital-to-analog converter DAC, an analog-to-digital converter ADC, an initialization switch SW1, and a sampling switch SW2.

The DAC can generate the data voltage for sensing a threshold voltage Vdata at the same level or different levels for first and second sensing periods under the control of the timing controller 124 and can output the generated data voltage to the data voltage supply line 14A. The DAC converts the compensated image data MDATA into the data voltage for displaying an image under the control of the timing controller 124 for an image display period, and outputs the converted data voltage to the data voltage supply line 14A.

The initialization switch SW1 switches current flow between an input terminal of the initialization voltage Vpre and the sensed voltage readout line 14B. The sampling switch SW2 switches current flow between the sensed voltage readout line 14B and the ADC. The ADC converts an analog sensed voltage Vsen stored in the sensing capacitor Cx into a digital value and supplies the converted digital value to the timing controller 124.

The sensing operation process performed under the control of the timing controller 124 is as follows. When the first and second gate pulses SCAN and SEN for sensing a threshold voltage are applied to the sub-pixel SP at an ON level Lon for the sensing operation, the first switching TFT ST1 and the second switching TFT ST2 are turned on. In this connection, the initialization switch SW1 in the data driver circuit 126 is turned on.

When the first switching TFT ST1 is turned on, the data voltage for sensing a threshold voltage Vdata is supplied to the first node N1. When the initialization switch SW1 and the second switching TFT ST2 are turned on, the initialization voltage Vpre is supplied to the second node N2. In this connection, a voltage Vgs between a gate and a source of the driving TFT DT is greater than a threshold voltage Vth, and thus, currents Ioled and Ids flow between the drain and the source of the driving TFT DT. A source voltage VN2 of the driving TFT DT charged in the second node N2 due to these currents Ioled and Ids gradually increases. Accordingly, the source voltage VN2 of the driving TFT DT follows a gate voltage VN1 of the driving TFT DT until the voltage Vgs between the gate and the source of the driving TFT DT reaches the threshold voltage Vth.

The source voltage VN2 of the driving TFT DT which increases at the second node N2 is stored as the sensed voltage Vsen in the sensing capacitor Cx formed at the sensed voltage readout line 14B via the second switching TFT ST2. The sensed voltage Vsen is detected when the sampling switch SW2 in the data driver circuit 12 is turned on within the sensing period in which the second gate pulse SEN for sensing a threshold voltage is maintained at an ON level. The detected sensed voltage Vsen is supplied to the ADC.

In one embodiment of the present disclosure, the timing controller 124 allows the sensing operation on one horizontal line to be performed after one frame of the image data is displayed and before a next frame thereof is displayed for the image display operation.

Hereinafter, a method for controlling a flexible display device according to an operation process of a rollable display apparatus according to an embodiment of the present disclosure will be described. This method can be implemented in any of the display devices discussed above and below according to one or more embodiments of the present disclosure.

FIG. 7 shows a state in which a portion of a display panel of a rollable display apparatus is exposed and the display panel is stopped according to an embodiment of the present disclosure. FIG. 8 shows a situation in which an exposed area increases as the display panel of the rollable display apparatus shown in FIG. 7 moves in an extending direction. FIG. 9 shows a state in which the movement of the display panel of the rollable display apparatus shown in FIG. 8 is completed.

As shown in FIG. 7, while the display panel 106 of the flexible display device provided in the rollable display apparatus 1 according to an embodiment of the present disclosure is not fully but partially exposed outwardly of the housing 112, only an exposed area 160 is exposed, an image is displayed. In this case, the image is displayed only in the exposed area 160, while the image is not displayed in an area excluding the exposed area 160.

In this connection, the display panel 106 is stopped, e.g., movement of the display panel 106 is stopped or paused. While the display panel 106 is stopped, the distance D between the sensor 208 and the top face of the housing 112 is sensed by the sensor 208 in real time. The timing controller 124 identifies the distance D between the sensor 208 and the top face of the housing 112 as measured by the sensor 208.

The timing controller 124 identifies whether the display panel 106 moves, based on the distance D between the sensor 208 and the top face of the housing 112. When the distance D between the sensor 208 and the top face of the housing 112 does not change but remains at a constant value, the timing controller 124 determines that the display panel 106 does not move but is stopped. However, when the distance D between the sensor 208 and the top face of the housing 112 changes, the timing controller 124 determines that the display panel 106 is moving. In an embodiment of FIG. 7, since the distance D between the sensor 208 and the top face of the housing 112 is maintained at a constant value, the timing controller 124 determines that the display panel 106 is in the stopped state.

Further, the timing controller 124 detects the exposed area of the display panel 106 based on the distance D between the sensor 208 and the top face of the housing 112. As described above, the sensor 208 is disposed at the same level as the top of the display panel 106. Thus, the distance D between the sensor 208 and the top face of the housing 112 can be regarded as the distance between the top of the display panel 106 and the top face of the housing 112. Therefore, the timing controller 124 defines an area corresponding to the distance D between the sensor 208 and the top face of the housing 112 in the entire area of the display panel 106 as the exposed area 160, for example, the area that is visible to the user. Further, the timing controller 124 defines an area except for the exposed area 160 in the entire area of the display panel 106 as the non-exposed area.

Further, the timing controller 124 defines a portion of the non-exposed area as a margin area 161. As shown in FIG. 7, the margin area 161 is continuous with the exposed area 160. A size of the margin area 161 can vary according to embodiments.

When the exposed area 160 and the margin area 161 of the display panel 106 are set, the timing controller 124 determines a combination of the exposed area 160 and the margin area 161 as a sensing target area as an area on which the sensing operation is to be performed. For example, in the embodiment of FIG. 7, all horizontal lines of the sub-pixel array included in the exposed area 160 and the margin area 161 are determined as the sensing target area. However, in another embodiment of the present disclosure, only the exposed area 160 can be determined as the sensing target area.

Further, when it is identified that the display panel 106 is in the stopped state, the timing controller 124 determines a sensing scheme of the display panel 106 as a random sensing scheme. The random sensing scheme refers to a scheme in which a horizontal line among horizontal lines included in the sensing target area is randomly selected and then the selected line is sensed. Therefore, according to the random sensing scheme, after one frame is displayed and before a next frame is displayed, one horizontal line among the horizontal lines included in the sensing target area is randomly selected, and a sensing operation of the selected horizontal line is performed.

When the sensing target area and the sensing scheme are determined, the timing controller 124 allows the sensing operation on the sensing target area to be performed according to the determined sensing scheme. Therefore, in the embodiment of FIG. 7, each time one frame is displayed, one horizontal line is randomly selected among all the horizontal lines of the sub-pixel array included in the exposed area 160 and the margin area 161, and then, the sensing operation is performed on the selected horizontal line.

In one example, in another embodiment of the present disclosure, the timing controller 124 can identify the movement state of the display panel 106 based on a displacement of the motor 204 for rotating the roller 108. When the motor 204 rotates, the displacement of the motor 204 is changed while the roller 108 rotates. Thus, the display panel 106 moves under the rotation of the roller 108. Therefore, when the displacement of the motor 204 is not changed and remains constant, the timing controller 124 can determine that the display panel 106 is in the stopped state.

As shown in the embodiment of FIG. 7, when a portion of the display panel 106, for example, only the exposed area 160 is exposed outwardly of the housing 112, the image is displayed only in the exposed area 160, so that the sensing operation can be performed only on the exposed area 160. When the display panel 106 suddenly extends via the user's command while sensing and deterioration compensation are performed only on the exposed area 160, there can be a difference between an image quality of the exposed area 160 subjected to the sensing and the deterioration compensation and an image quality of the margin area 161 not subjected to the sensing and the deterioration compensation. This difference in the image quality is expressed as a boundary line between the exposed area 160 and the margin area 161, thereby causing the image quality of the rollable display apparatus 1 to deteriorate.

However, in an embodiment of the present disclosure, a sensing operation is performed not only on the exposed area 160 but also on the margin area 161 that is continuous with the exposed area 160 or adjacent to the exposed area 160. Therefore, when the display panel 106 extends from a state in which the display panel 106 is stopped as shown in FIG. 7, the difference between the image quality of the exposed area 160 and the image quality of the margin area 161 not subjected to the deterioration compensation is significantly reduced, so that the boundary line between the exposed area 160 and the margin area 161 is not recognized by the user, thereby improving the image quality of the rollable display apparatus 1.

Further, as shown in FIG. 7, the remaining area in the entire area of the display panel 106 except for the exposed area 160 and the margin area 161 are kept wound around the roller 108. However, electrical characteristics such as a parasitic resistance component, a parasitic capacitor component, and a parasitic inductance component of the area wound around the roller 108 differ from those of an area as unwound around the roller 108 and fully unfolded. Therefore, when deterioration compensation is applied to the area wound around the roller 108 based on a sensed value of the area wound around the roller 108, normal deterioration compensation is not performed on the area wound around the roller 108. Thus, a normal image display may not be realized when the area wound around the roller 108 is unfolded or unwound. Therefore, as shown in the embodiment of FIG. 7, while a portion of the display panel 106, for example, only the exposed area 160 is exposed outwardly of the housing 112, the sensing operation is not performed on the remaining area except for the sensing target area, for example, the exposed area 160 and the margin area 161.

Further, as in the embodiment of FIG. 7, when only a portion of the entire area of the display panel 106 is designated as the sensing target area, the sensing operation and the deterioration compensation are performed only on the horizontal line included in the sensing target area, such that faster sensing and deterioration compensation are realized.

In one example, as shown in FIG. 7, only the partial area of the display panel 106 is exposed outwardly of the housing 112, and the display panel 106 can extend via the user's command from a state in which the display panel 106 is stopped. In this case, as the roller 108 rotates in the second direction, and thus, the display panel 106 wound around the roller 108 is released therefrom, and thus, the display panel 106 moves in the extending direction (indicated by an arrow).

As the display panel 106 moves, the distance D measured by the sensor 208 increases. The timing controller 124 can detect that the distance D measured by the sensor 208 is not constant and changes and thus can identify that the display panel 106 is moving.

Upon identifying that the display panel 106 is in the movement state, the timing controller 124 determines the sensing target area as a to-be-exposed horizontal line. In accordance with the present disclosure, the to-be-exposed horizontal line is contained not in the exposed area 160 but in the non-exposed area, and refers to a horizontal line that is to be exposed outwardly of the housing 112 under the movement of the display panel 106.

In the example of FIG. 8, the to-be-exposed horizontal line includes horizontal lines adjacent to the exposed area 160 among the horizontal lines included in an area except for the exposed area 160 in the entire area of the display panel 106. For example, the to-be-exposed horizontal line sequentially includes horizontal lines below the lowest horizontal line of the exposed area 160 one by one. For example, when the lowest horizontal line of the exposed area 160 is a 300-th horizontal line of the display panel 106, the to-be-exposed horizontal line includes a 301-th horizontal line located below the 300-th horizontal line. As the display panel 106 moves in the extending direction, for example, in an upper direction on a 1 horizontal line basis, the to-be-exposed horizontal line sequentially includes horizontal lines located below the 301-th horizontal line (302-th horizontal line, 303-th horizontal line, . . . ) one by one.

In another example, the to-be-exposed horizontal line can be a horizontal line adjacent to the margin area 161 among horizontal lines included in an area other than the exposed area 160 and the margin area 161 in the entire area of the display panel 106. For example, when the lowest horizontal line of the margin area 161 is a 350-th horizontal line of the display panel 106, the to-be-exposed horizontal line is determined as a 351-th horizontal line located below the 350-th horizontal line. As the display panel 106 moves in the extending direction, for example, for example, in an upper direction on a 1 horizontal line basis, the to-be-exposed horizontal line sequentially includes horizontal lines located below the 351-th horizontal line (352-th horizontal line, 353-th horizontal line, . . . ) one by one. In this case, sequential sensing and deterioration compensation on the to-be-exposed horizontal line are not exposed to the user.

Further, upon identifying that the display panel 106 is in the movement state, the timing controller 124 determines the sensing scheme as the sequential sensing scheme. The sequential sensing scheme refers to a scheme in which sensing is performed sequentially on a 1 horizontal line basis according to a predefined order. Therefore, according to the sequential sensing scheme, the sensing operation is sequentially performed on the to-be-exposed horizontal line which sequentially changes on a 1 horizontal line basis, until the display panel 106 stops.

When the sensing target area and the sensing scheme are determined, the timing controller 124 allows a sensing operation on the sensing target area to be performed according to the determined sensing scheme. Therefore, in the embodiment of FIG. 8, the sensing operation on the to-be-exposed horizontal line is performed sequentially from a time when the movement of the display panel 106 starts to a time when the display panel 106 stops as shown in FIG. 9. Accordingly, sensing operation and deterioration compensation are not performed on the remaining area except for the to-be-exposed horizontal line while the display panel 106 is moving.

For example, it is assumed that the display panel 106 starts to move from a stopped state as in the embodiment shown in FIG. 7, and stops as in the embodiment shown in FIG. 9. In this case, it is assumed that the lowest horizontal line of the exposed area 160 in FIG. 7 is a 300-th horizontal line, and the lowest horizontal line of an exposed area 162 in FIG. 9 is a 1000-th horizontal line. The to-be-exposed horizontal line becomes a horizontal line immediately adjacent to the exposed area 160 among the horizontal lines included in an area in the entire area of the display panel 106 except for the exposed area 160, for example, becomes a horizontal line (e.g., 301-th horizontal line) immediately adjacent to the lowest horizontal line (e.g., 300-th horizontal line) of the exposed area 160, and then becomes a horizontal line immediately adjacent to the 301-th horizontal line, and so on. In this case, the sensing operation and the deterioration compensation are sequentially performed on the 301-th horizontal line, the 302-th horizontal line, the 303-th horizontal line, . . . , the 1000-th horizontal line until display panel 106 stops.

As described above, according to an embodiment of the present disclosure, while the display panel 106 is extending, sensing and deterioration compensation on a previously exposed area are not activated, but immediate sensing operation and deterioration compensation are performed on an area to be exposed due to the movement of the display panel 106. Therefore, the image quality in the process of extending the display panel 106 and the image quality when the extension of the display panel 106 is completed are improved.

In one example, in another embodiment of the present disclosure, the timing controller 124 can identify the movement state of the display panel 106 based on the displacement of the motor 204 for rotating the roller 108. When the motor 204 rotates, the displacement of the motor 204 changes and thus the roller 108 rotates, and thus the display panel 106 moves under the rotation of the roller 108. Therefore, when the displacement of the motor 204 changes, the timing controller 124 can determine that the display panel 106 is moving.

Further, in another embodiment of the present disclosure, the timing controller 124 can detect the exposed area of the display panel 106 based on the displacement of the motor 204 for rotating the roller 108. As described above, the display panel 106 extends or contracts according to the rotation direction of the roller 108. Therefore, an amount of change in the displacement of the motor 204 that rotates the roller 108 is proportional to the moving distance of the display panel 106. Therefore, the timing controller 124 can calculate the moving distance of the display panel 106 based on the amount of change in the displacement of the motor 204, and can determine the size of the exposed area of the display panel 106 based on the calculated moving distance.

In one example, the display panel 106 extends as shown in FIG. 8 or stops as shown in FIG. 9. When the display panel 106 stops as shown in FIG. 9, the distance D between sensor 208 and the top face of housing 112 measured by sensor 208 remains constant again. When the distance D measured by the sensor 208 remains constant, the timing controller 124 identifies that the display panel 106 is in the stopped state.

Further, when the display panel 106 is stopped, the timing controller 124 detects the exposed area 162 of the display panel 106 again, based on the distance D measured by the sensor 208. As the exposed area 162 is re-defined, the margin area 163 adjacent to the exposed area 162 is re-defined.

When it is identified that the display panel 106 is in the stopped state, the timing controller 124 determines the sensing scheme of the display panel 106 as the random sensing scheme.

Further, the timing controller 124 determines a combination of the exposed area 162 and the margin area 163 as the sensing target area on which a sensing operation is to be performed. In another embodiment of the present disclosure, only the exposed area 162 can be determined as the sensing target area.

When the sensing target area and the sensing scheme are determined, the timing controller 124 allows a sensing operation to be performed on the sensing target area according to the determined sensing scheme. Therefore, in the embodiment of FIG. 9, whenever one frame is displayed, one horizontal line is randomly selected among all horizontal lines of the sub-pixel array included in the exposed area 162 and the margin area 163, and the sensing operation is performed on the selected horizontal line.

FIG. 10 is a flow chart showing a method for controlling a flexible display device according to an embodiment of the present disclosure.

Referring to FIG. 10, the timing controller 124 identifies the movement state of the display panel 106 (step 1002). In an embodiment of the present disclosure, the timing controller 124 can identify the movement state of the display panel 106 based on the distance between the display panel 106 and the housing 112 measured by the sensor 208 disposed on one end of the display panel 106. In another embodiment of the present disclosure, the timing controller 124 can identify the movement state of the display panel 106 based on the displacement of the motor 204 for rotating the roller 108.

Next, the timing controller 124 identifies the exposed area of the display panel 106 (step 1004). In an embodiment of the present disclosure, the timing controller 124 can identify the exposed area of the display panel 106 based on the distance between the display panel 106 and the housing 112 measured by the sensor 208 disposed on one end of the display panel 106. In another embodiment of the present disclosure, the timing controller 124 can identify the exposed area of the display panel 106 based on the displacement of the motor 204 for rotating the roller 108.

Next, the timing controller 124 determines the sensing target area based on the movement state of the display panel 106 and the exposed area thereof (step 1006).

In one embodiment of the present disclosure, in determining the sensing target area (step 1006), when the display panel 1006 is in a stopped state, at least one of the exposed area or the predefined margin area of the display panel 106 can be determined as the sensing target area. Further, in an embodiment of the present disclosure, the margin area can be a non-exposed area of the display panel 106.

Further, in another embodiment of the present disclosure, determining the sensing target area (step 1006) includes determining the to-be-exposed horizontal line of the display panel 106 as the sensing target area when the display panel 106 is extending. In another embodiment of the present disclosure, the to-be-exposed horizontal line can be contained in an area other than the predefined margin area in the non-exposed areas of the display panel 106. Further, in another embodiment of the present disclosure, the to-be-exposed horizontal line can be contained in the predefined margin area.

Next, the timing controller 124 determines the sensing scheme to be applied to the sensing target area (step 1008).

In one embodiment of the present disclosure, determining the sensing scheme (step 1008) includes determining the sensing scheme as the random sensing scheme when the display panel 106 is in a stopped state. Further, in another embodiment of the present disclosure, determining the sensing scheme (step 1008) includes determining the sensing scheme as the sequential sensing scheme when the display panel 106 is extending.

When the sensing target area and the sensing scheme are determined, the timing controller 124 allows a sensing operation to be performed on the sensing target area according to the determined sensing scheme (step 1010).

The method for controlling the flexible display device according to an embodiment of the present disclosure can further include disallowing a sensing operation to be performed on the exposed area when the display panel 106 is extending.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A flexible display device comprising:
   a display panel configured to move through a panel passage opening defined in a housing, wherein the display panel includes a plurality of sub-pixels; and
   a controller configured to:
   determine an exposed area of the display panel that is exposed outwardly of the housing and a non-exposed area of the display panel that remains within the housing, and
   preform a threshold voltage sensing operation on at least one sub-pixel that is located within the exposed area of the display panel, the threshold voltage sensing operation including sensing a threshold voltage of a driving thin-film transistor corresponding to the at least one sub-pixel, wherein at least a portion of the non-exposed area of the display panel is excluded from being sensed by the threshold voltage sensing operation, wherein when the display panel is in a stopped state, the exposed area and a predefined margin area of the display panel are determined as a sensing target area for performing the threshold voltage sensing operation, and wherein the predefined margin area is contained in the non-exposed area of the display panel.

2. The flexible display device of claim 1, wherein the controller is further configured to:

determine a movement state of the display panel, in response to the movement state of the display panel being a stopped state, perform the threshold voltage sensing operation on the at least one sub-pixel in the exposed area according to a first sensing scheme, and in response to the movement state of the display panel being an active moving state, perform the threshold voltage sensing operation on the at least one sub-pixel in the exposed area according to a second sensing scheme, the second sensing scheme being different than the first sensing scheme.

3. The flexible display device of claim 2, wherein the first sensing scheme includes randomly selecting a horizontal line of sub-pixels from among a plurality of horizontal lines of sub-pixels for the threshold voltage sensing operation, and wherein the second sensing scheme includes sequentially selecting a plurality of horizontal lines of sub-pixels according to a predefined order for the threshold voltage sensing operation.

4. The flexible display device of claim 1, wherein the predefined margin area is continuous with the exposed area or adjacent to the exposed area.

5. The flexible display device of claim 1, wherein the threshold voltage sensing operation is not performed on a remaining area except for the sensing target area, the exposed area and the predefined margin area.

6. A rollable display apparatus comprising:

a housing having a panel passage opening defined therein;

a roller mounted inside the housing;

a motor connected to the roller so as to rotate the roller; and a flexible display device wound around the roller, wherein the flexible display device is configured to move through the panel passage opening under a rotation of the roller, wherein the flexible display device includes:

a display panel including a plurality of sub-pixels; and a controller configured to:

determine an exposed area of the display panel that is exposed outwardly of the housing and a non-exposed area of the display panel that remains within the housing, and preform a threshold voltage sensing operation on at least one sub-pixel that is located within the exposed area of the display panel, the threshold voltage sensing operation including sensing a threshold voltage of a driving thin-film transistor corresponding to the at least one sub-pixel, wherein at least a portion of the non-exposed area of the display panel is excluded from being sensed by the threshold voltage sensing operation, wherein when the display panel is in a stopped state, the exposed area and a predefined margin area of the display panel are determined as a sensing target area for performing the threshold voltage sensing operation, and wherein the predefined margin area is contained in the non-exposed area of the display panel.

7. The rollable display apparatus of claim 6, wherein the controller is further configured to:

determine a movement state of the display panel, in response to the movement state of the display panel being a stopped state, perform the threshold voltage sensing operation on the at least one sub-pixel in the exposed area according to a first sensing scheme, and in response to the movement state of the display panel being an active moving state, perform the threshold voltage sensing operation on the at least one sub-pixel in the exposed area according to a second sensing scheme, the second sensing scheme being different than the first sensing scheme.

8. The rollable display apparatus of claim 7, wherein the first sensing scheme includes randomly selecting a horizontal line of sub-pixels from among a plurality of horizontal lines of sub-pixels for the threshold voltage sensing operation, and wherein the second sensing scheme includes sequentially selecting a plurality of horizontal lines of sub-pixels according to a predefined order for the threshold voltage sensing operation.

9. The rollable display apparatus of claim 6, wherein the predefined margin area is continuous with the exposed area or adjacent to the exposed area.

10. The rollable display apparatus of claim 6, wherein the threshold voltage sensing operation is not performed on a remaining area except for the sensing target area, the exposed area and the predefined margin area.

* * * * *